(12) United States Patent
Kowalski et al.

(10) Patent No.: US 6,529,146 B1
(45) Date of Patent: Mar. 4, 2003

(54) SYSTEM AND METHOD FOR SIMULTANEOUSLY ENCODING DATA IN MULTIPLE FORMATS AND AT DIFFERENT BIT RATES

(75) Inventors: Stephen Francis Kowalski, Hacienda Heights, CA (US); Richard Prentiss Jensen, Los Angeles, CA (US); Damon Andrew Darling, Oceanside, CA (US); Joshua Dov Joseph Sharfman, Los Angeles, CA (US)

(73) Assignee: Interactive Video Technologies, Inc., New York, NY (US)

( * ) Notice: Subject to any disclaimer, the term of this patent is extended or adjusted under 35 U.S.C. 154(b) by 0 days.

(21) Appl. No.: 09/590,469

(22) Filed: Jun. 9, 2000

(51) Int. Cl.[7] .......................... H03M 7/00; H04N 7/173
(52) U.S. Cl. ........................................ 341/50; 725/132
(58) Field of Search ............................ 725/132, 14, 22; 345/433, 717, 723; 341/60, 50; 375/240.26

(56) References Cited

U.S. PATENT DOCUMENTS

| 5,635,979 | A | * | 6/1997 | Kostreski et al. ............ 725/132 |
| 5,872,565 | A | * | 2/1999 | Greaves et al. ............. 345/723 |
| 6,031,576 | A | * | 2/2000 | Kykendall ............. 375/340.26 |
| 6,115,035 | A | * | 9/2000 | Compton et al. ........... 345/717 |
| 6,160,501 | A | * | 12/2000 | Tallam ........................ 341/60 |
| 6,288,723 | B1 | * | 9/2001 | Huff et al. .................. 345/433 |

* cited by examiner

Primary Examiner—Patrick Wamsley
(74) Attorney, Agent, or Firm—Christie, Parker & Hale, LLP

(57) ABSTRACT

A system and method for simultaneously and synchronously encoding a data signal in multiple formats and at multiple bit rates. According to one aspect of the invention, plural encoding stations are controlled by one central controller, which controls the encoding format carried out by each encoding station, and also controls the commencement of the encoding process to ensure that each encoding station simultaneously commences the encoding process, thereby synchronizing the encoded streams.

45 Claims, 8 Drawing Sheets

SYSTEM AND METHOD FOR SIMULTANEOUSLY ENCODING DATA IN MULTIPLE FORMATS AND AT DIFFERENT BIT RATES

FIELD OF THE INVENTION

The present invention relates to processing data and, more particularly, to a system and method that simultaneously performs data encoding in multiple formats and at various bit rates.

BACKGROUND OF THE INVENTION

Computer networks, such as the Internet, wide area networks (WAN), local area networks (LAN), and the like, are used for many different purposes. One of the major purposes of such a network is the transmission of data from one location to another, for example, from a central hub to a plurality of end user terminals. Such data can be simple text data, or can consist of a combination of text and graphical data. In addition, video and corresponding audio data can be transmitted from one site to another, either as streaming media, or as a standard data file that is downloaded and then displayed on the users' displays. As is well known to those skilled in the art, streaming media offers the advantage that the display of the media can commence before the entire media file has been downloaded. A portion of the file is downloaded and stored in a buffer, and then the file begins to be displayed while the remainder of the file continues to download. Thus, bandwidth considerations are critical in the case of streaming media. If bandwidth capability is too small, there may be undesirable pauses in the playback of the media file while the remainder of the file is received.

Because video files are typically very large, efficiently transmitting those files over a computer network requires that the data be compressed in some manner to work within the amount of available bandwidth offered by the network. Thus, video files are often encoded by a compression technique into an encoded bitstream and then transmitted over the network. At the receiving end, the encoded bitstream is then decoded to reconstruct the original data signals, which are then displayed on a suitable display.

In the case of streaming media, it is highly desirable that the data be compressed, so that the amount of data that must be transferred and buffered before commencing display of the media can be relatively small. This reduces the amount of time an end user must wait before the media is displayed to them.

Currently, there are a number of encoding formats that are used to perform data compression, because each format offers certain advantages and disadvantages over the others for particular applications. Unfortunately, these formats are typically incompatible with each other. Thus, if a signal is broadcast in one encoded format, only those end users who receive the signal and have the appropriate decoder will be able to decode and view the data. Accordingly, it is desirable to encode a data signal in multiple formats to be accessible by a larger percentage of the end users.

In addition, users who have access to the Internet and other such networks typically have varying bandwidth capabilities. For example, some users are connected to the Internet through either a 28.8K or 56K modem that provide for relatively small data transfer rates. Others are connected through an integrated service digital network ("ISDN") which provides much faster data transfer rates. Still others are connected through T1 lines, DSL lines, and the like, which provide even larger bandwidth capabilities.

Thus, in the case of streaming media, if a data signal is encoded at only one bit rate that can be received by all end users, the end users with relatively large bandwidth capabilities will be presented with media having much less quality than it otherwise could have. Conversely, if the data signal is encoded at a high bit rate, the end users with small bandwidth capabilities will not be able to view the data signal in a continuous fashion, as the system will have to buffer the information required to display the data signal. Accordingly, it is desirable to encode the data at different bit rates, so that all end users can view the data, and so that, at the same time, those having high bandwidth capabilities can receive a relatively high quality data signal.

Others have proposed systems that encode a data signal at different bit rates. Those systems incorporate a plurality of separate encoders that are arranged such that each encoder receives the video signal, and are individually set to encode at different bit rates. An example of such a system is shown in FIG. 1. A signal (typically containing both audio and video) from a signal source 10 is transmitted to plural audio and video distribution amplifiers 12 and 14. The amplified signals are then introduced to plural encoders 16, each of which is separately controlled to encode the incoming stream. Thus, the single video stream is encoded at different bit rates. However, by using separate encoders which are controlled by separate controllers, offset issues are usually experienced within the various encoded signals. Thus, the need exists for a system and method whereby one or more data signals can be encoded at multiple bit rates and in multiple formats, and in which the various encoded streams are synchronized to provide concurrent, real-time encoding. The present invention addresses these needs.

SUMMARY OF THE INVENTION

In a preferred embodiment, the present invention is directed to a system and method for simultaneously and synchronously encoding a data signal in multiple formats and at multiple bit rates. According to one aspect of the invention, plural encoders are controlled by one central controller or a graphical interface, which controls the settings of each encoder, and also controls the commencement and termination of the encoding process to ensure that each encoder starts and stops encoding at substantially the same time, thereby synchronizing the encoded streams.

In one embodiment, the present invention is directed to a system for processing a data signal, including plural encoders and a single controller connected to the respective encoders. The controller is operative to control the respective encoders to set the formats of the encoders and the respective bit rates at which they will encode the data.

In another embodiment, the system includes a unified user interface that allows a user to input desired encoding formats and formatting parameters for each of the encoders. The unified user interface then may interact with each encoder to control the encoding process through the single interface.

In yet another embodiment, the invention is directed to a method of encoding an incoming data signal, comprising receiving input from a user with respect to desired encoding formats and encoding parameters, retrieving one or more encoder objects based upon the selected encoding formats, configuring the encoder objects based upon the selected encoding parameters, linking the encoder objects to corresponding encoding stations to control encoding at the respective stations, and encoding the incoming data at the respective stations, with each station encoding the data based on the corresponding configured encoder object.

DETAILED DESCRIPTION OF THE INVENTION

Figure 1:
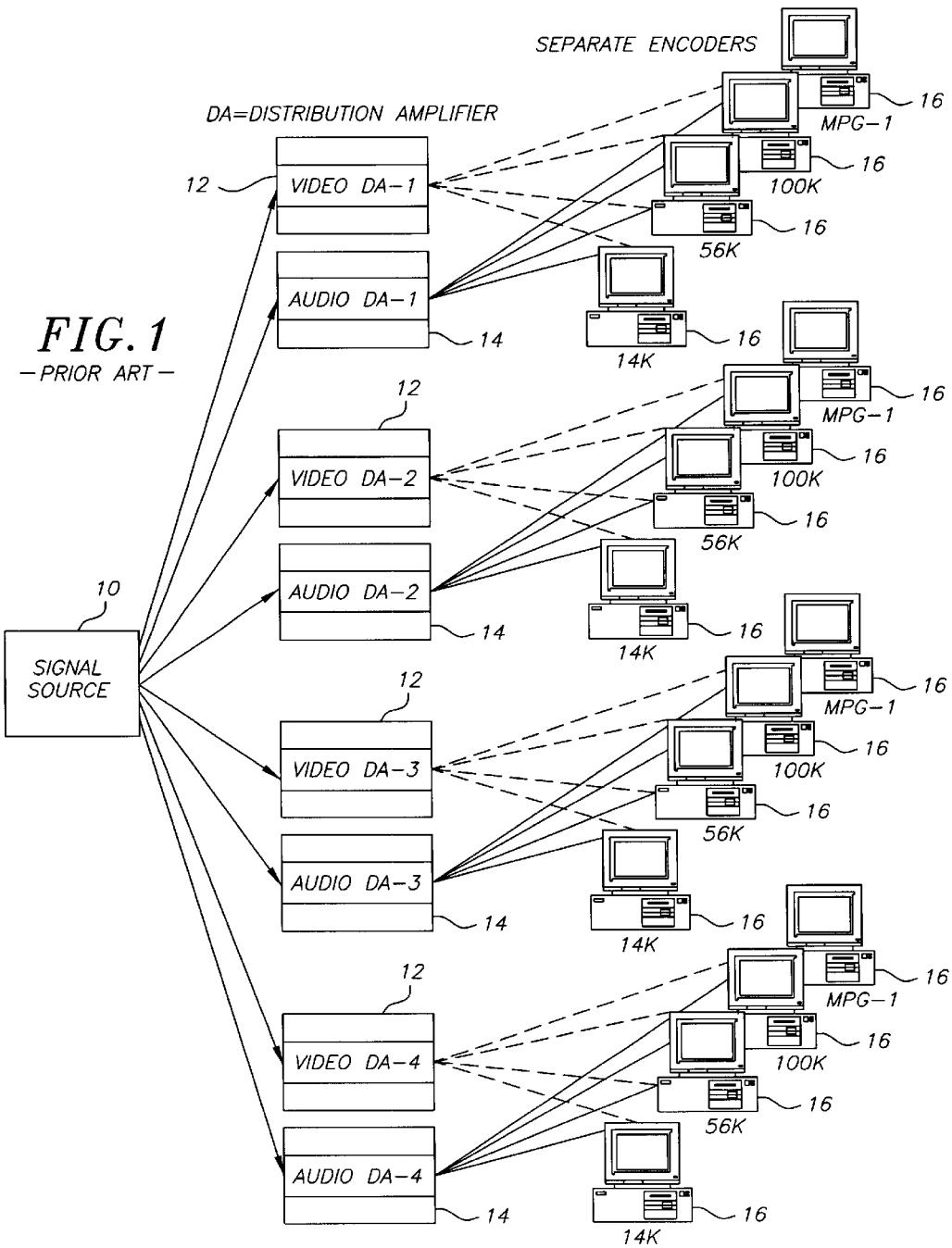
FIG. 1 schematically illustrates a conventional encoding system that requires a plurality of separate encoders.
Figure 2:
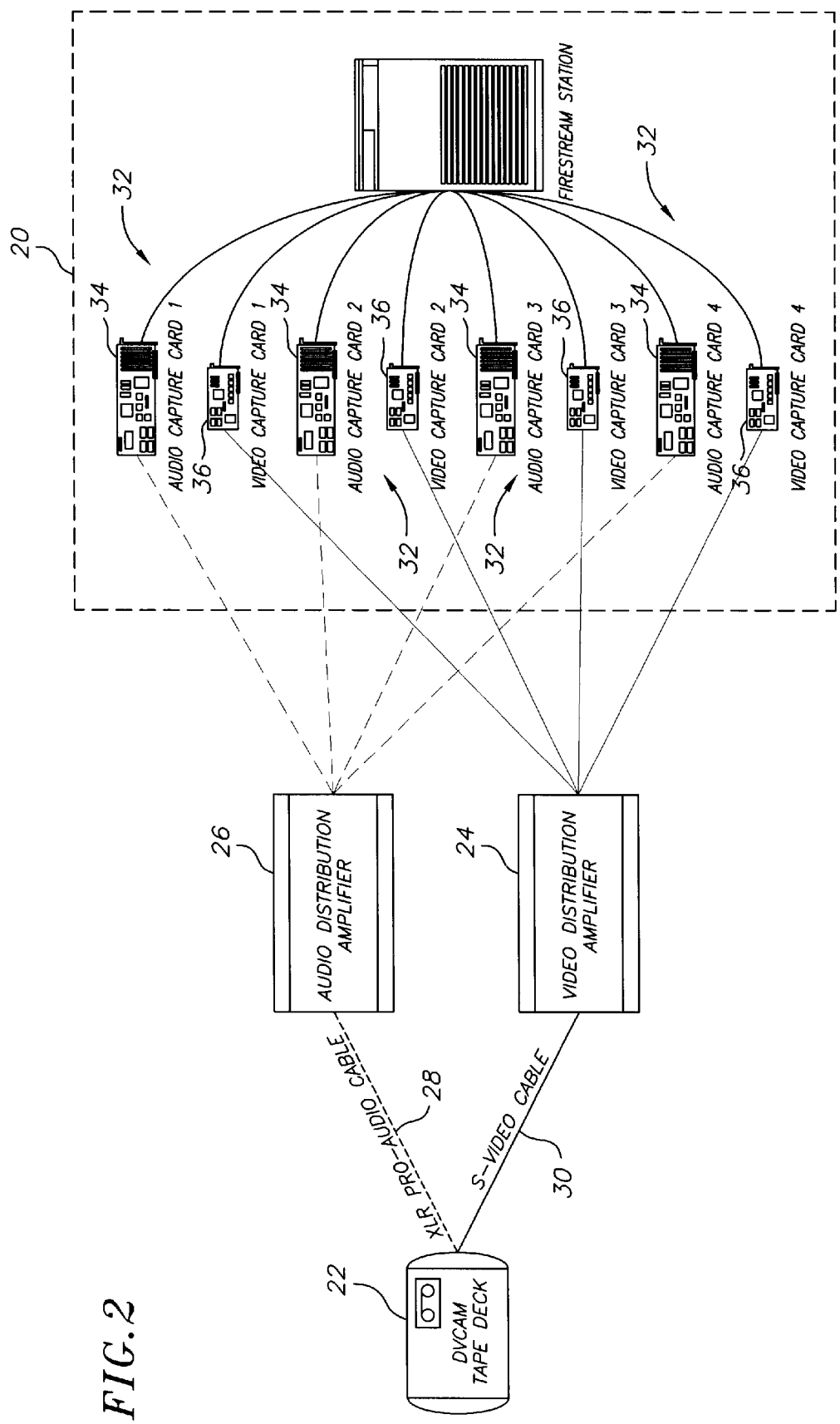
FIG. 2 is a schematic diagram showing certain aspects of an encoding system according to one illustrative embodiment of the present invention.
Figure 4:
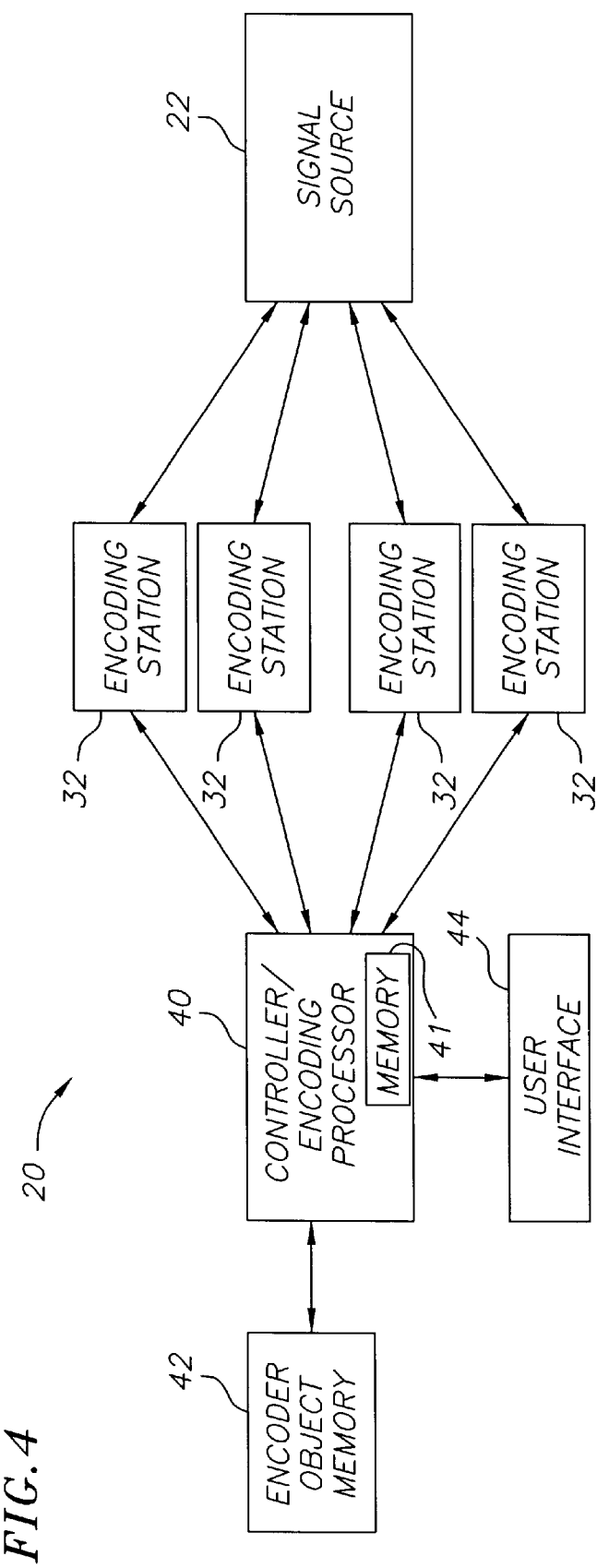
FIG. 4 is a block diagram showing additional components included in the encoding system of FIG. 2.

Referring to FIGS. 2 and 4, a novel encoding system 20 is disclosed according to one illustrative embodiment of the invention. The system 20 is designed to concurrently encode an incoming data signal in multiple formats and at multiple bit rates. System 20 incorporates a single controller which simultaneously controls a plurality of encoding stations, thereby ensuring that there is no offset between the respective encoded signals. System 20 incorporates a plurality of encoder stations comprising video and/or audio capture cards which are controllable to simultaneously encode the incoming data signal at various bit rates and in various selected formats.

The term "data signal" as used herein is intended to refer to any suitable continuous stream media. In one embodiment, the data stream includes both video and audio data. Alternatively, the data stream can consist of one or more of the following: video, audio, screen capture, animation, telemetry, and any other suitable data.

System 20 receives a data signal from a source 22, for example, a DVCam tape deck or other suitable signal source. Examples of other signal sources include Hi-8, Betacam, DVCPRO, and VHS devices, as well as live feeds in serial digital, PAL, NTSC Composite, SECAM, Component Video, and other formats. It will be apparent to those skilled in the art that the signal source can provide a digital signal or an analog signal.

The system 20 also includes respective video and audio distribution amplifiers 24 and 26 that receive the data signal from respective audio and video cables 28 and 30, and which amplify the respective portions of the incoming data signal and forward the amplified digital signals on to the various encoding stations. In one embodiment, audio cable 28 is an XLR Pro-Audio Cable, and video cable 30 is a conventional S-video cable.

System 20 includes plural encoding stations, generally designated 32. In one embodiment, each encoding station 32 includes one or more data capture components, for example, an audio capture card 34 and video capture card 36. Each audio capture card 34 is connected to audio distribution amplifier 26 to receive the amplified audio signal. Similarly, each video capture card 36 is connected to video distribution amplifier 24 to receive the amplified video signal.

Audio and video distribution amplifiers 24 and 26 may include respective audio and video mixers to provide respective mixed signals to each of the encoding stations 32.

According to one illustrative embodiment, one or more of the video capture cards 36 is designed such that it can encode in more than one format. For example, one of capture cards 36 may be selected such that it can encode in two or more formats, for example, in ASF ("Advanced Streaming Format") and RM ("Real Media") formats. A suitable video capture card for encoding in two or more formats is the Osprey 100 capture card, available from Osprey Technologies of Morrisville, N.C. A suitable audio capture card is Antex Model Number SC-22, available from Antex Electronics Corporation of Gardena, Calif.

In another illustrative embodiment, each video capture card 36 of the respective encoding stations 32 may be selected such that it can encode in a unique format. For example, one capture card may be selected such that it can encode in ASF format, another card may be selected such that it can encode in RM format, and the other cards may be selected to encode in other different formats.

One or more of the encoding stations 32 may be designated to encode in MPEG-1 or MPEG-2 format, in which case audio and video capture cards 34 and 36 of that encoding station are preferably combined into a single card, for example, the FutureTel Primeview Solo Combo capture card which encodes in MPEG-1 format, or any other suitable capture card.

While in the illustrative embodiment each encoding station 32 includes a pair of capture cards 34 and 36, it will be apparent to those skilled in the art that the encoding stations may consist of various components. For example, each encoding station may consist of a single card, more than two cards, one or more integrated circuit chips, or any other suitable components. Alternatively, each encoding station may consist purely of software that is controlled by the corresponding encoder object, firmware, and/or any combination thereof. Thus, it will be understood that the present invention is not limited to any particular type of encoding station, but rather is suitable for use with various types of encoding stations, including hardware-implemented, software-implemented, and hybrid (i.e., hardware and software) stations.

Referring now to FIG. 4, additional components of system 20 will be described in more detail. System 20 includes a controller 40 connected to each audio and video capture card 34 and 36. Controller 40 is operative to control the respective audio and video capture cards to encode the incoming data at selected bit rates and in selected formats based on a user's selections, as is described in greater detail below in connection with FIG. 5.

While in one embodiment system 20 is shown and described as including four (4) encoding stations 32, it will be apparent that system 20 may include more or less encoding stations 32, depending on user preferences.

Controller 40 is also connected to memory 42. Memory 42 stores multiple encoder object programs (or encoder process programs) that can be retrieved and implemented by controller 40 to control the respective audio and video capture cards 34 and 36 with respect to encoding bit rates and encoding formats. Controller retrieves particular encoder objects and reads them into controller memory 41. The encoder objects set forth the various sequences of data processing steps for the various encoding formats, which are then applied by the respective cards to the incoming audio and video data to create the various encoded bit streams.

Thus, as used herein, the term "encoder object" may refer to any software code for controlling an encoder.

Controller 40 is also connected to a user interface 44 which includes a graphical user interface, for example, a display 70 (FIG. 6), and an input device (not shown), such as a conventional keyboard, keypad, mouse, or the like. Controller 40 interacts with a user through user interface 44 to initialize the system 20, as is described in detail below in connection with FIG. 5.

Figure 5:
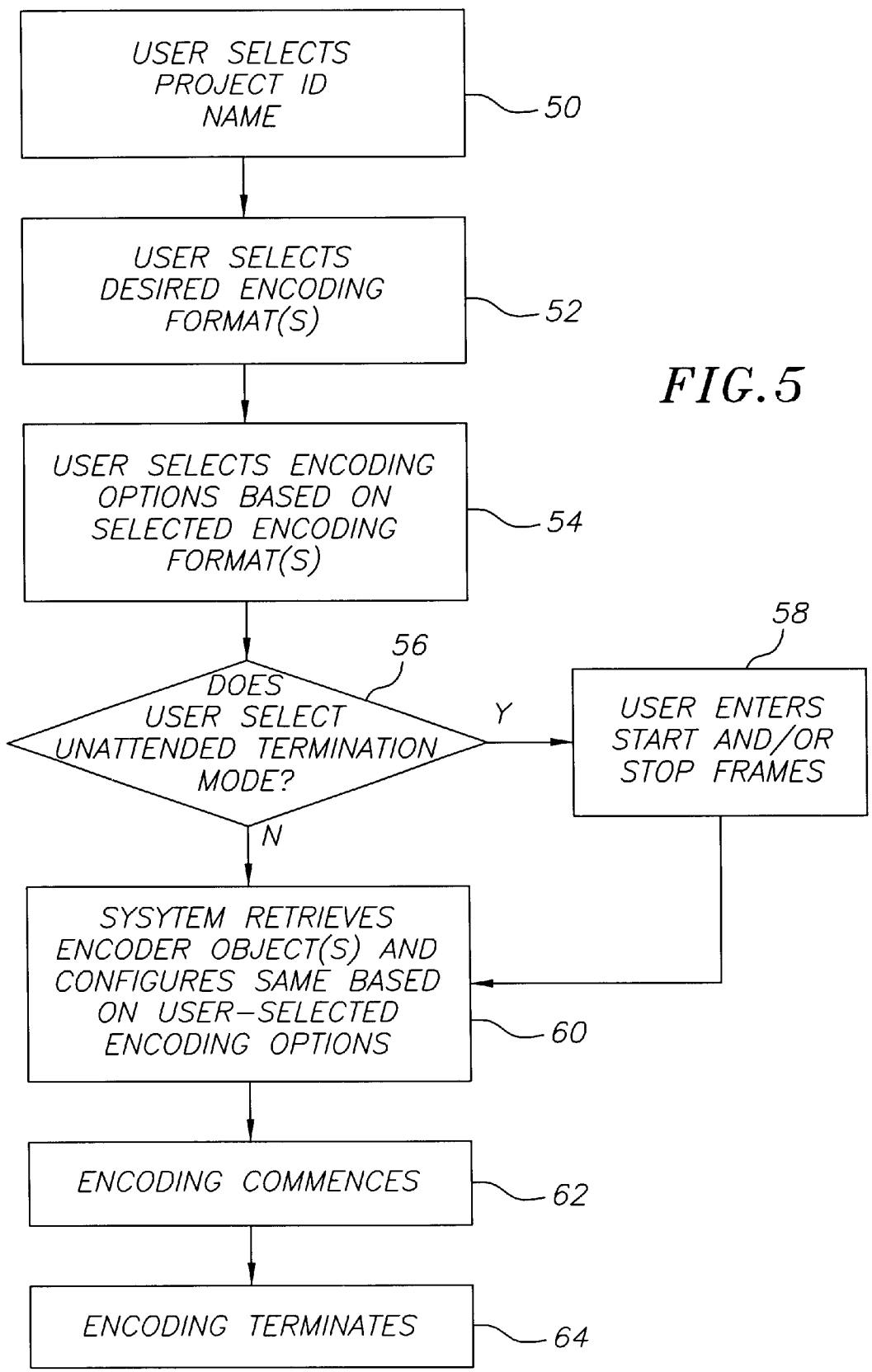
FIG. 5 is a flow chart of the operational steps involved in connection with the systems of FIGS. 2 through 4.

Referring now to FIG. 5, a preferred initialization and encoding method of the present invention is described. The process begins at step 50, with controller 40 receiving a project identifier name from the user in response to a request by controller 40. In one illustrative embodiment, the project identifier serves as a common prefix for each encoded video file from the same source content. Typically, a project ID box 72 (e.g., an input box) will be provided by controller 40 on the user interface 70 (FIG. 6), into which the user enters any desired character string to serve as the project name.

At step 52, the user selects the desired encoding formats for one or more of the encoding stations 32. In one illustrative embodiment, system 20 includes four pairs of video and audio capture cards 34 and 36. Thus, the user may select the desired audio and video formats and bit rates for each pair. In one embodiment, the user first selects the encoding type for each of the encoding stations 32. For example, the user may select between ASF, RM, MPEG, and any other encoding formats, from a list provided by controller 40.

Alternatively, one or more of the encoding stations 32 may be fixed with respect to the encoding format in which it may encode, such as an encoding station that is designed to encode only in MPEG-1 or MPEG-2 format, such as a suitable card from FutureTel. In this situation, the user need not select the encoding format for that encoding station.

Once the encoding formats are set for each encoding station, either as selected by the user, as dictated by system 20, or both, operation proceeds to step 54, and the user selects stream options for each of the encoding types. The options may include one or more of the following: bandwidth, audio codec type, audio format, video codec type, video quality, crispness, video height, video width, frame rate, frequency (in the case of I-frame generation) and output file name. The options can include still other parameters that are germane to a particular encoding format. For example, in the case of screen animation, other parameters may include frame rate, animation height and width, and the like. The selections can be input through drop-downs, input boxes, lists of selectable options, or any other suitable means.

Thus it will be apparent that, for each of the encoding stations 32, system 20 provides a large degree of flexibility in customizing each station. For example, in one pair the video capture card can be configured to encode in ASF format with a 56K bandwidth, with an MPEG-4 video codec, and with a frame size of 224×164. Similarly, the audio capture card can be configured to encode in a desired format (e.g., either 8 kb/s, 8 khz, mono; or 16 kb/s, 16 khz, stereo). Another of the encoding stations 32 can be configured to also encode in ASF format, but with a different bandwidth and a different frame size.

Once the user has selected the options for the various encoding stations 32, operation proceeds to query block 56, and the system 20 determines whether the user desires to encode with unattended termination of the encoding process. If so, operation proceeds to step 58, and the user enters start and stop frames, which are used by the system 20 to automatically control the commencement and termination of the encoding procedure. The start and stop frames may be input through input boxes 74 and 76 on user interface 70, or in any other suitable manner. As is well known in the art, frames are represented in many ways, for example, in a sequential manner (i.e., frames 1 to n), and in Society of Motion Pictures and Television Editing (SMPTE) formats. Thus, the stop frame information may be in various forms.

Alternatively, rather than entering stop frame information, the user may enter stop time information (i.e., terminate encoding after 10 minutes).

In one embodiment, the input boxes 74 and 76 are provided on user interface 44, such that if the user enters start and stop frame values, then at step 56 the system 20 automatically determines that unattended termination is desired, and step 58 is bypassed.

It will be apparent to those skilled in the art that the particular sequence of steps prior to initialization is not critical, and that many different sequences may be employed according to the present invention.

In any event, after the user has entered the start and stop frames, or if the user does not selected unattended termination, operation proceeds to step 60, and controller 40 initializes the respective encoding stations 32 based on the formats and options selected by the user. Initialization involves retrieving various encoder object programs from memory 42 based on the encoding formats selected by the user, or those dictated by system 20 for one or more of encoding stations 32. The encoder objects are read into memory 41 of controller 40 and are then configured by controller 40 based on the options selected by the user. Each encoder object is associated with a suitable one of encoding stations 32 to control the capture card(s) of that particular station. The controller 40 then controls the encoding process performed by that station 32 based on the configured encoding object, as is well known in the art.

In one illustrative embodiment, if one of the format selections is ASF format, controller 40 retrieves and configures an ASF real time encoder object based on the options selected by the user that are stored in an ASD configuration file. If one of the format selections is RM format, controller 40 retrieves a RealProducer™ real time encoder object and passes the user-selected settings to the encoder object. Similarly, if one of the selected formats is MPEG, the user-selected option are used to retrieve and configure a FutureTel real time encoder object or any other suitable encoding object that encodes in MPEG format.

Once the encoder objects are loaded into memory 41 of controller 40 and are configured based on the user-selected options, operation proceeds to step 62, and controller 40 simultaneously commands each encoder object to begin encoding. Each encoder object then controls the assigned encoding station to encode the incoming data in a particular format, at a particular bit rate, and according to the other parameters selected by the user.

In one illustrative embodiment, controller 40 has the ability to control the signal source 22 programmatically. At the same time, or just before controller commands each encoder object to begin encoding, controller 40 transmits a control signal to signal source 22 to command signal source 22 to begin transmitting the data signal. As such, system 20 provides a fully automated encoding system.

The command to begin encoding can be generated in response to the user making a request that encoding begin. Also, in the situation where the user selects unattended termination and selects a start frame, encoding automatically begins when the corresponding frame is received by system 20.

In one illustrative embodiment, prior to the commencement of encoding, controller 40 creates a subdirectory in a data directory based on the value entered in the project ID box 72 by the user. The encoded bit streams are then saved in that subdirectory with their respective unique file names. For example, the file name of each encoder stream can be a concatenation of the character string entered in box 72, the bandwidth of that stream, and the encoding format for that stream, such as "XYZ123a56.asf".

Encoding continues until step 64, at which time encoding is terminated. Such termination can be done either manually, by the user making a request to terminate the encoding procedure, or can be done automatically in the unattended termination mode, when the corresponding stop frame is received by system 20.

Therefore, it will be apparent to those skilled in the art that the system 20 of the present invention provides a number of benefits. By including a single controller 40, the total number of components is reduced, thereby resulting in a relatively simple, cost-efficient system. By having a single controller control each encoding station 32, the encoding stations can be synchronized so that there is reduced or no offset with respect to starting and ending times of the encoded signals. Moreover, system 20 presents a unified user interface such that a user need not deal with multiple interfaces. And system 20 provides for encoding in multiple formats.

Figure 3:
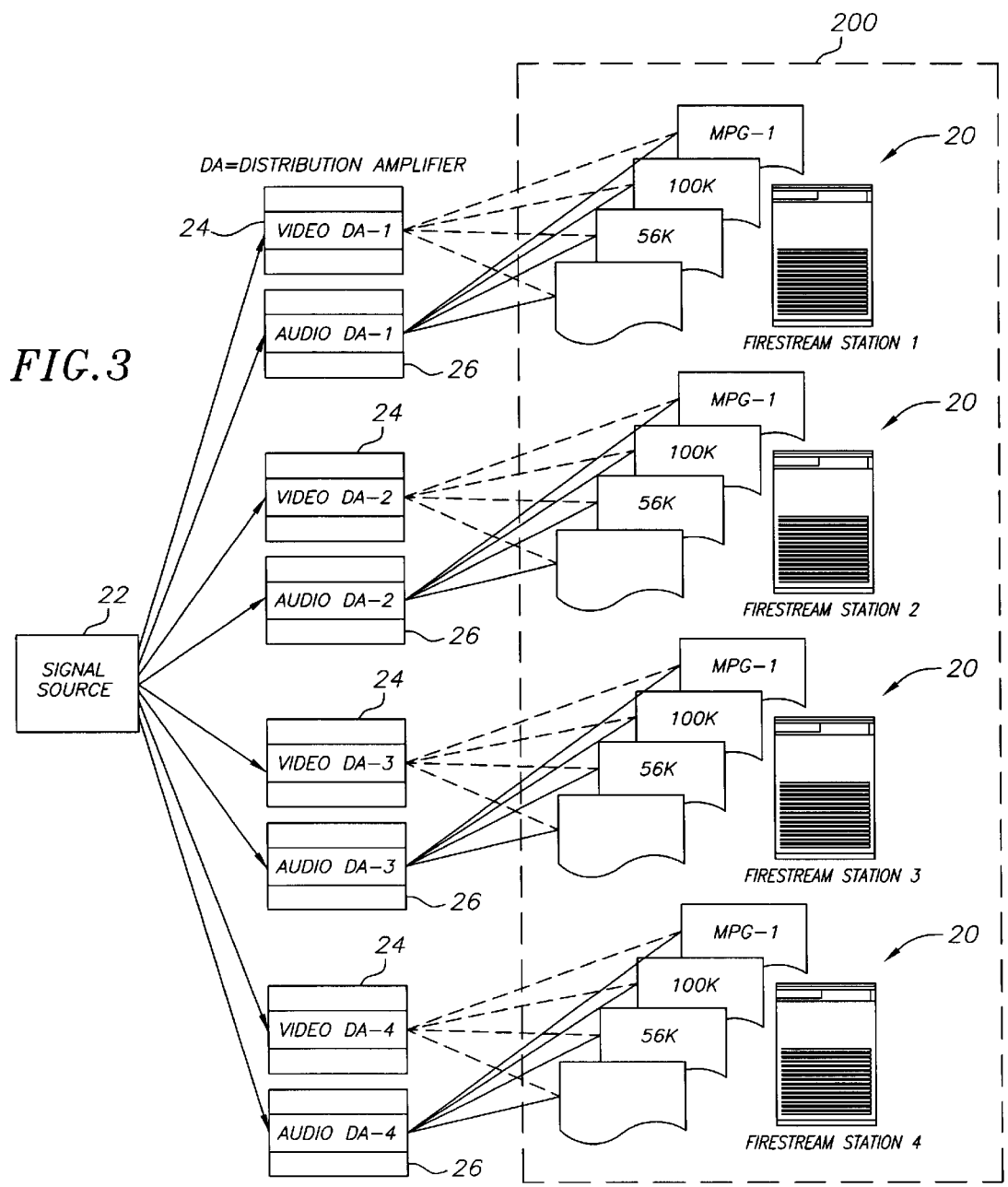
FIG. 3 is a schematic diagram which illustrates a second illustrative embodiment of the invention.

Referring to FIG. 3, there is shown an alternate embodiment of a system 200 according to the present invention. System 200 includes four separate encoding systems 202, each of which is preferably identical to system 20 of FIG. 2. Thus, in the embodiment disclosed in FIG. 3, system 200 is capable of simultaneously encoding up to 16 separate streams based on one incoming data signal. Each of the four systems 202 includes a video and audio distribution amplifier 204 and 206, which are preferably identical to the amplifiers 24 and 26 of FIG. 2. Each pair of amplifiers introduces the incoming signal to a corresponding one of the encoding systems 202.

Figure 6:
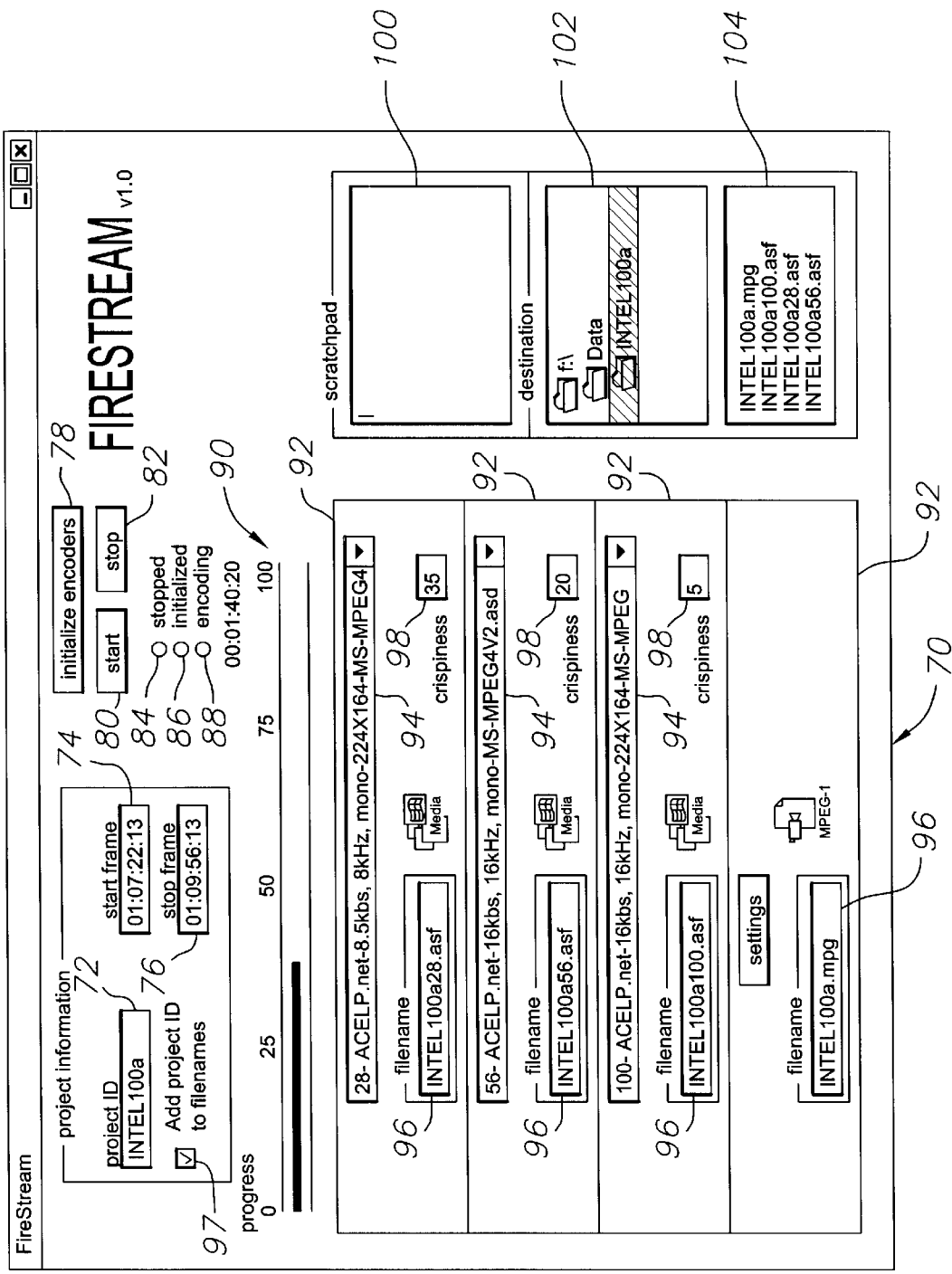
FIG. 6 is a screen shot representation of a graphical user interface utilized in an illustrative embodiment of the invention.

Referring now to FIG. 6 in more detail, there is shown a screen shot of one suitable form of graphical interface 70 which may be utilized by system 20 to interact with users. The screen shot incorporates a number of drop-down menus and input boxes to allow users to enter desired format and option information as is described above. In the illustrated embodiment, the screen shot includes a project information box that includes project ID input box 72, as well as start and stop frame input boxes 74 and 76. Also included are a plurality of selectable buttons 78, 80, and 82 which may be clicked by a user to control operation of system 20. Button 78 is an "Initialize encoders" button, which may be selected by a user after making their format and option selections. Buttons 80 and 82 are, respectively, start and stop buttons which may be selected by the user to start or stop the encoding process in a manual encoding procedure. As described above, by making one selection, system 20 preferably simultaneously controls all of the capture cards 34 and 36 to synchronize the encoding process.

In the illustrative embodiment, graphical interface 70 also includes three status indicators 84, 86, and 88, which indicate to the user the state of system 20. Those lights correspond with respective stopped, initialized, and encoding states of system 20. A progress bar 90 is also included to indicate to the user how much of the encoding job has been completed, based upon the start and stop frame values.

The graphical interface 70 also preferably includes a plurality of encoder selection boxes 92, one for each capture card pair. Based on the encoding format selected, an appropriate drop-down menu 94 will be provided in the respective encoder selection boxes 92, from which the user may select the options for that encoding format, as described above. Each box 92 also includes a file name box 96, which may be an input box, or alternatively displays a unique file name generated by system 20 based on the project ID name input in box 72, the encoding format and bit rate selected by the user, in response to selection by user of a check box 97. For example, if the user inputs "XYZ123a" as the project ID name, and selects ASF format and 28K bandwidth, and selects check box 97, the file name may be "XYZ123a28.asf".

Each box 92 further includes a crispness box 98, which is an input box that allows a user to select the crispness of the video signal. It will be understood that the graphical interface may include additional input boxes to allow for input of information with respect to other parameters.

In the illustrative embodiment, graphical interface 70 includes a scratchpad 100 which is an input box that allows a user to post messages for subsequent users. For example, in the case of a relatively long encoding process, one user may post instructions before they leave, so that the subsequent user will receive the instructions when they view the interface.

The graphical interface also includes a file destination box 102, which allows a user to select the file path for storing the respective encoded streams. A filename box 104 lists the names of the respective files to which the encoded streams from each capture card pair are being saved.

While in one embodiment the encoding stations 32 can all perform encoding in multiple formats, it will be apparent to those skilled in the art that system 20 may incorporate one or more encoding stations 32 that encode in only one format. For example, system 20 may include a station that allows for encoding in MPEG-1 format, such as a FutureTel Primeview Solo Combo card, which encodes both video and audio in MPEG-1 format. Thus, system 20 may include encoding stations which all encode in multiple formats, with some stations that encode in multiple formats, or with encoding stations that all encode in only a single format. In addition, the various formats may vary depending on end user preferences. For example, the encoding stations may be selected such that they all can encode in ASF format, or such that some encode in ASF format while others encode in RM format, or where the encoding stations all encode in unique formats. Thus, system 20 may be dynamically configured based on end user needs.

Therefore, while the system 20 has been described in connection with certain encoding formats by way of examples, it will be understood by those skilled in the art that system 20 is designed for use with various encoding formats. Thus, the exemplary formats disclosed herein are not intended to in any way limit the scope of the invention.

In addition, while controller 40 is described herein as serving as the encoding processor that configures the encoder objects and applies those objects to the various encoding stations 32, it will be apparent that system 20 may include a separate encoding processor that is in communication with controller 40' to control encoding at the various encoding stations 32.

Figure 7:
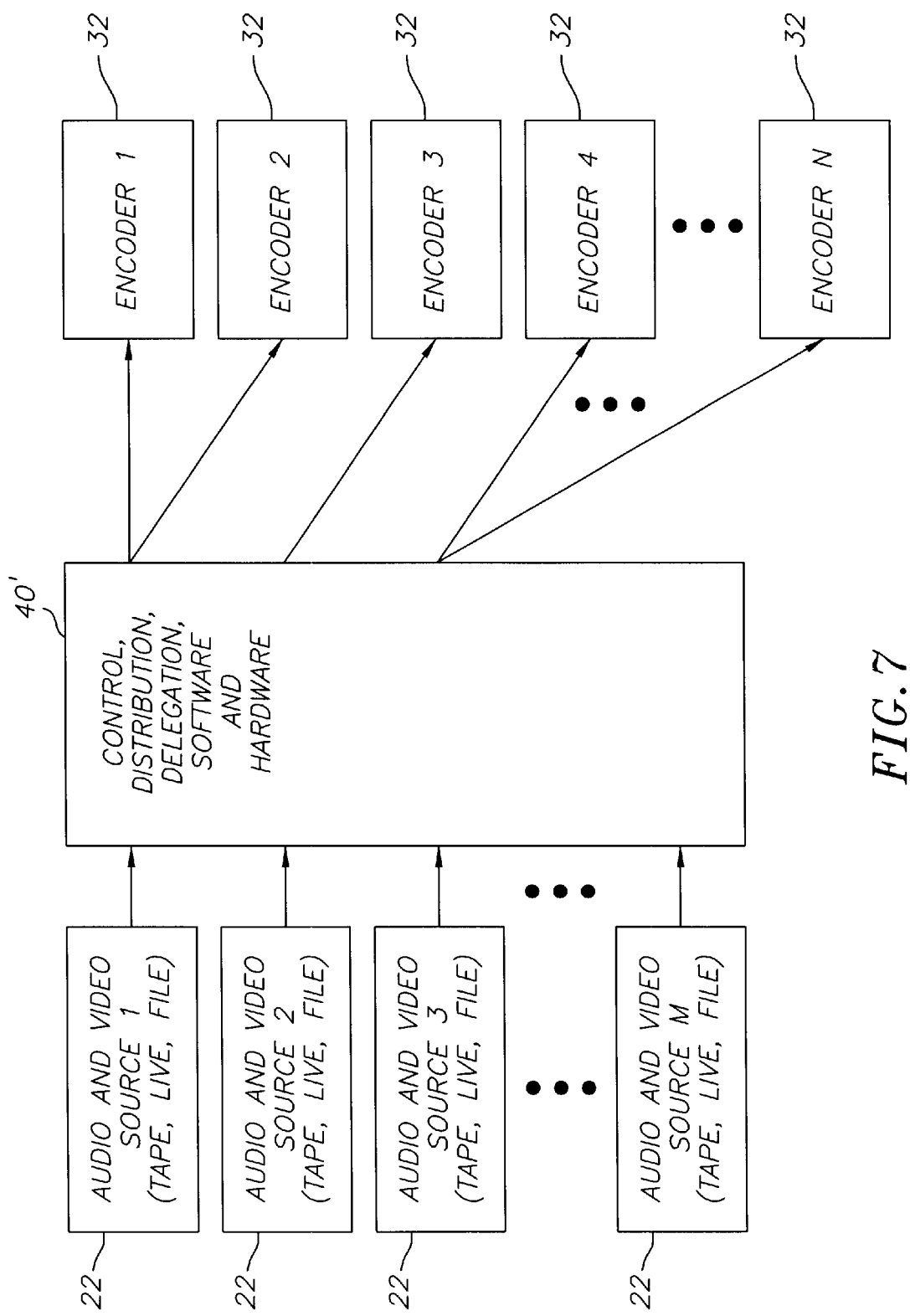
FIG. 7 is a block diagram of yet another illustrative embodiment of the invention.
Figure 8:
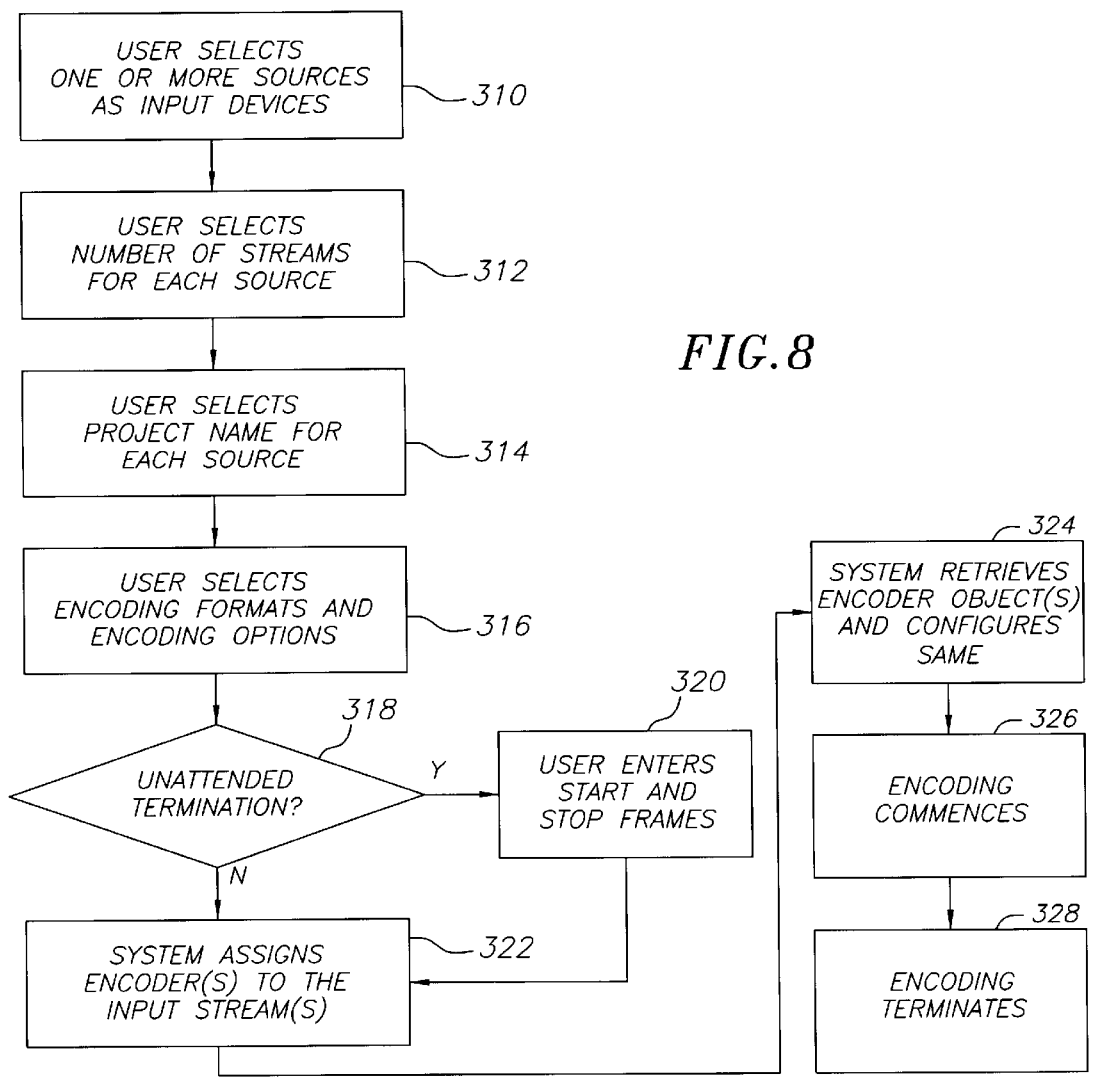
FIG. 8 is a flow chart of the operational steps involved in connection with the system of FIG. 7.

Referring now to FIGS. 7 and 8, there is shown a system 300 according to another illustrative embodiment of the invention. System 300 is similar in many respects to system 20 of FIGS. 2 through 4, and is designed to simultaneously receive input streams from multiple signals sources 22 and connect the respective input streams to a dynamic set of encoding stations. For example, system 300 may include ten encoding stations 32 and two signal input sources 22. System 300 allows a user to dynamically assign the input streams to one or more of the encoding stations 32. For example, one of sources 22 may be connected to four of the encoding stations 32, while the other source 22 is connected to three of the remaining encoding stations 32, leaving three encoding stations unused.

In this embodiment, controller 40' is programmed to store data relating to the formatting capabilities of each encoding station 32, and also determine the status of each encoding station 32 (i.e., whether the stations are currently encoding another input stream and, if so, when the encoding process will be completed). Thus, in this embodiment controller 40' is programmed to perform controlling, delegating, and scheduling functions.

Referring now to FIG. 8, an illustrative method of system 300 is described. The process begins at step 310, with a user selecting one or more of the input sources 22 from which to receive input streams. At step 312, the user selects the number of encoded streams desired for each source. For example, the user may desire to have two encoded streams for each input source, with one being in ASF format and the other in RM format. Alternatively, the user may desire one encoded stream for one input, and two or more for another of the inputs.

In one embodiment, at step 312 controller 40' determines whether there are enough available encoding stations 32 based on the number and type of encoding formats input by the user. If there are not enough available encoding stations 32, controller 40' generates an appropriate message that is displayed on user interface 44. The user may then change their selections, or prioritize the encoding processes, such that one or more of the encoding processes will begin immediately, and with the user-entered selections relating to the other encoding process(es) being stored by controller 40' until the necessary encoding stations become available, at which time the encoding format and option selections are retrieved by controller 40'.

In any case, operation then proceeds to step 314, and the user selects a project name for each selected input source 22, similar to step 50 of FIG. 5, but repeated one or more times depending on the number of selected input sources. Then, at step 316, the user selects encoding formats and encoding options for each of the encoded streams. Thus, in the case where the user selects two input sources and desires two encoded output streams for each source, the user will select a total of four encoding formats and the associated encoding options as described above in connection with FIG. 5.

At query block 318, system 300 determines whether the user desires unattended termination for the encoding process. If so, at step 320 the user enters start and stop frames, again doing so for each of the selected incoming streams.

At step 322, controller 40' is programmed to dynamically assign the incoming streams to the respective encoding stations 32. Controller 40' determines the appropriate encoding stations 32 based on the desired encoding formats input by the user and based on encoder availability, and assigns the incoming stream(s) to those appropriate stations.

Then, at step 324, controller 40' retrieves one or more encoder objects based on the formats selected by the user, and configures those objects based on the options input by the user, similar to step 60 of FIG. 5.

Once the encoder objects are loaded into memory 41 of controller 40' and are configured based on the user-selected options, operation proceeds to step 326, and controller 40' simultaneously commands each encoder object to begin encoding. Each encoder object then controls the assigned encoding station to encode the incoming data in a particular format, at a particular bit rate, and according to the other parameters selected by the user.

Then, at step 328, encoding terminates, either as directed by a user, or automatically as dictated by the stop frame information input by the user.

From the foregoing, it will be apparent to those skilled in the art that the system and method of the present invention provide for encoding incoming data signals in various formats and at various bit rates. By controlling various capture cards with a single controller, the encoding process is synchronized with respect to each of the capture cards, thereby reducing or eliminating any offset between the respective encoded streams.

While the above description contains many specific features of the invention, these should not be construed as limitations on the scope of the invention, but rather as exemplary embodiments thereof. Many other variations are possible. Accordingly, the scope of the invention should be determined not by the embodiments illustrated, but by the appended claims and their legal equivalents.

What is claimed is:

1. In an encoding system having multiple encoding stations for encoding an incoming data signal, and a controller connected to the respective encoding stations, a method of encoding the incoming signal, comprising:

receiving input from a user with respect to desired encoding formats and encoding parameters;

retrieving one or more encoder objects based upon the selected encoding formats;

configuring the encoder objects based upon the selected encoding parameters;

linking the encoder objects to corresponding encoding stations to control encoding at the respective stations; and encoding the incoming data at the respective stations, with each station encoding the data as dictated by the corresponding configured encoder object.

2. The method of claim 1, wherein retrieving one or more encoder objects comprises retrieving at least two encoder objects corresponding to at least two unique encoding formats.

3. The method of claim 1, wherein retrieving one or more encoder objects comprises retrieving a unique encoder object for each encoding station.

4. The method of claim 1 wherein linking the encoder objects to corresponding encoding stations comprises linking the encoder objects to both a video capture card and an audio capture card.

5. The method of claim 1 wherein linking the encoder objects to corresponding encoding stations comprises linking the encoder objects to a combined audio and video capture card.

6. The method of claim 1 wherein linking the encoder objects to corresponding encoding stations comprises linking the encoder objects to a software encoding object.

7. The method of claim 1, wherein encoding the incoming data is synchronously commenced at each encoding station.

8. The method of claim 1, further including transmitting a control signal to the signal source to actuate the source.

9. A system for encoding an incoming data signal, comprising:

a plurality of encoding stations, each of which is connected to a source of the incoming data signal;

a controller connected to each encoding station and responsive to format and parameter selections from a user to retrieve corresponding encoder objects and configure said objects to control encoding of each encoding station.

10. The system of claim 9, further including a graphical user interface connected to the controller and which allows a user to interact with the controller.

11. The system of claim 10, wherein the graphical user interface includes an input device to allow a user to input information, wherein the graphical user interface is designed to transmit the information to the controller.

12. The system of claim 9, wherein each encoding station comprises at least one capture card.

13. The system of claim 9, wherein at least one of the encoding stations comprises an audio capture card and a video capture card.

14. The system of claim 9, wherein at least one of the encoding stations comprises a capture card that is designed to encode in multiple formats.

15. The system of claim 9, wherein each of the encoding stations comprises a capture card that is designed to encode in multiple formats.

16. The system of claim 9, wherein the controller is programmed to retrieve one or more encoder objects based on user-selected formats, and programmed to configure the objects based on format parameters input by a user.

17. The system of claim 9, wherein at least one of the encoding stations is designed to selectively encode in ASF and RM formats.

18. The system of claim 9, wherein the controller is programmed to synchronously commence encoding at each of the encoding stations.

19. The system of claim 9, wherein the controller is responsive to entry of encoding termination information from a user to automatically terminate an encoding process at a selected point based upon the encoding termination information.

20. The system of claim 9, wherein the controller is programmed to store the encoded streams in respective files having names that are concatenations of user-input information.

21. The system of claim 9, wherein the controller is connected to the source and is operative to transmit a control signal to the source to actuate the source.

22. A system for encoding an incoming data signal, comprising:
   a plurality of encoding stations, each of which is connected to a source of the incoming data signal;
   a controller connected to each encoding station and programmed to retrieve one or more encoder objects and simultaneously commence encoding at each station, wherein the encoding format is dictated by said encoder objects.

23. The system of claim 22, further including a graphical user interface connected to the controller and which allows a user to interact with the controller.

24. The system of claim 23, wherein the graphical user interface includes an input device to allow a user to input information, wherein the graphical user interface is designed to transmit the information to the controller.

25. The system of claim 22, wherein each encoding station comprises at least one capture card.

26. The system of claim 22, wherein at least one of the encoding stations comprises an audio capture card and a video capture card.

27. The system of claim 22, wherein at least one of the encoding stations comprises a capture card that is designed to encode in multiple formats, and wherein the controller is programmed to retrieve a particular encoder object based on an encoding format selected by a user.

28. The system of claim 22, wherein each of the encoding stations comprises a capture card that is designed to encode in multiple formats, and wherein the controller is programmed to retrieve particular encoder objects based on corresponding encoding formats selected by a user.

29. The system of claim 22, wherein the controller is programmed to retrieve one or more encoder objects based on user-selected formats, and programmed to configure the objects based on format parameters input by a user.

30. The system of claim 22, wherein at least one of the encoding stations is designed to selectively encode in ASF and RM formats.

31. The system of claim 22, wherein the controller is responsive to entry of encoding termination information from a user to automatically terminate an encoding process at a selected point based upon the encoding termination information.

32. The system of claim 22, wherein the controller is connected to the source and is operative to transmit a control signal to the source to actuate the source.

33. In an encoding system having multiple encoding stations for simultaneously encoding a plurality of data signals from plural signal sources, wherein said system further includes a controller connected to the respective encoding stations, a method of encoding the data signals, comprising:
   receiving input from a user that indicates which of the signal sources are selected for the encoding procedure;
   receiving input from a user with respect to selected encoding formats and encoding parameters for the data signals from the selected signal sources;
   retrieving one or more encoder objects based upon the selected encoding formats;
   configuring the encoder objects based upon the selected encoding parameters;
   linking the encoder objects to selected ones of the encoding stations to control encoding at the selected stations;
   assigning the incoming data signals from the selected signal sources to one or more of the selected encoding stations; and
   encoding the incoming data signals at the respective stations, with each station encoding the data as dictated by the corresponding configured encoder object.

34. The method of claim 33, wherein retrieving one or more encoder objects comprises retrieving at least two encoder objects corresponding to at least two unique encoding formats.

35. The method of claim 33, wherein retrieving one or more encoder objects comprises retrieving a unique encoder object for each encoding station.

36. The method of claim 33, wherein linking the encoder objects to corresponding encoding stations comprises linking the encoder objects to both a video capture card and an audio capture card.

37. The method of claim 33, wherein linking the encoder objects to corresponding encoding stations comprises linking the encoder objects to a combined audio and video capture card.

38. The method of claim 33, wherein linking the encoder objects to corresponding encoding stations comprises linking the encoder objects to a software encoding object.

39. The method of claim 33, wherein encoding the incoming data is synchronously commenced at each encoding station.

40. The method of claim 33, wherein receiving input from a user comprises receiving input corresponding to selection of at least two of the signal sources.

41. The method of claim 33, further including transmitting a control signal to the signal sources to actuate the sources.

42. The method of claim 33, further including determining whether sufficient encoding stations are then available based on the user-input information, and scheduling an encoding procedure to commence at a selected time if sufficient encoders are not then available.

43. The method of claim 33, further including determining and recording formatting capabilities of each encoding station.

44. The method of claim 33, further including determining encoding status of each encoding station.

45. A system for encoding an incoming data signal, comprising:

a plurality of encoding stations, each of which is connected to a source of the incoming data signal; and a user interface that is programmed to receive encoding format and format option information for each of the respective encoding stations, wherein the information is processed to create respective configured encoding objects for the respective encoding stations.

* * * * *